United States Patent [19]

Morrow

[11] 4,282,484
[45] Aug. 4, 1981

[54] COMBINATION SEISMIC/MAGNETIC TRANSDUCER WITH FLOATING MAGNET

[75] Inventor: Robert D. Morrow, Baltimore, Md.

[73] Assignee: Catalyst Research Corporation, Baltimore, Md.

[21] Appl. No.: 34,326

[22] Filed: Apr. 30, 1979

[51] Int. Cl.³ .................. G01R 33/038; G01H 11/00; H04R 11/00
[52] U.S. Cl. ..................................... 324/207; 73/652; 324/226; 367/185
[58] Field of Search ............... 324/200, 207, 208, 259, 324/226; 73/649, 652, 658, 660, 661, 784, 1 D, 1 DV; 335/219, 306; 340/690, 683; 367/182, 185–187

[56] References Cited

U.S. PATENT DOCUMENTS

| | | | |
|---|---|---|---|
| 2,300,198 | 10/1942 | Brown | 73/661 X |
| 2,748,370 | 5/1956 | Baltosser | 367/187 |
| 2,764,019 | 9/1956 | Lindholm et al. | 73/661 X |
| 2,870,427 | 1/1959 | Frank et al. | 324/207 |
| 2,985,823 | 5/1961 | Wright | 324/207 |
| 3,100,292 | 8/1963 | Warner et al. | 367/185 |
| 3,181,350 | 5/1965 | Thomas et al. | 73/661 X |
| 3,293,579 | 12/1966 | Harper | 335/306 X |
| 3,477,280 | 11/1969 | Blackmer | 324/207 UX |
| 3,498,114 | 3/1970 | Garber et al. | 73/661 X |
| 3,618,367 | 11/1971 | Merrill | 73/660 |
| 3,665,296 | 5/1972 | Gross et al. | 324/201 |

*Primary Examiner*—Gerard R. Strecker
*Attorney, Agent, or Firm*—Thomas H. Murray

[57] ABSTRACT

A combination seismic/magnetic transducer capable of detecting movement in a magnetically-permeable body or vibration within the body while it is stopped.

5 Claims, 2 Drawing Figures

U.S. Patent    Aug. 4, 1981    4,282,484
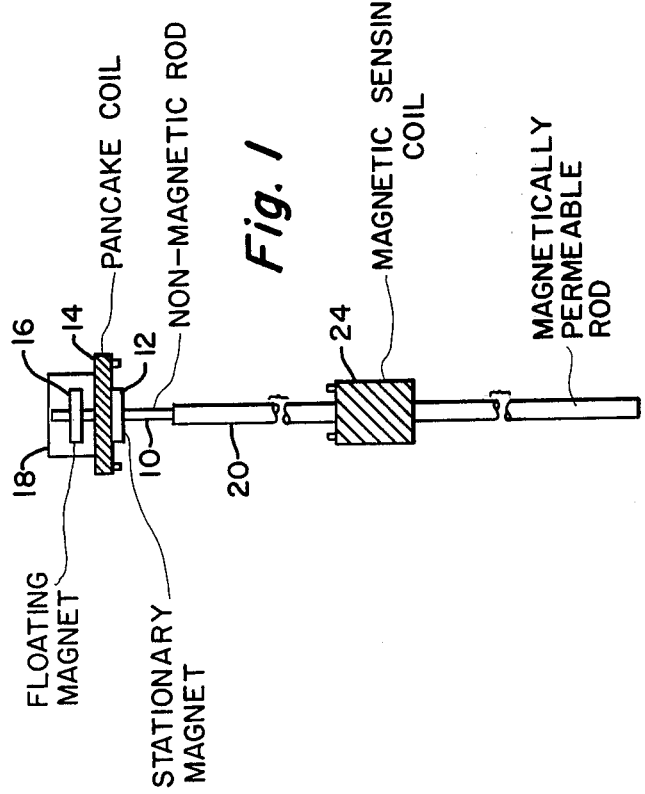
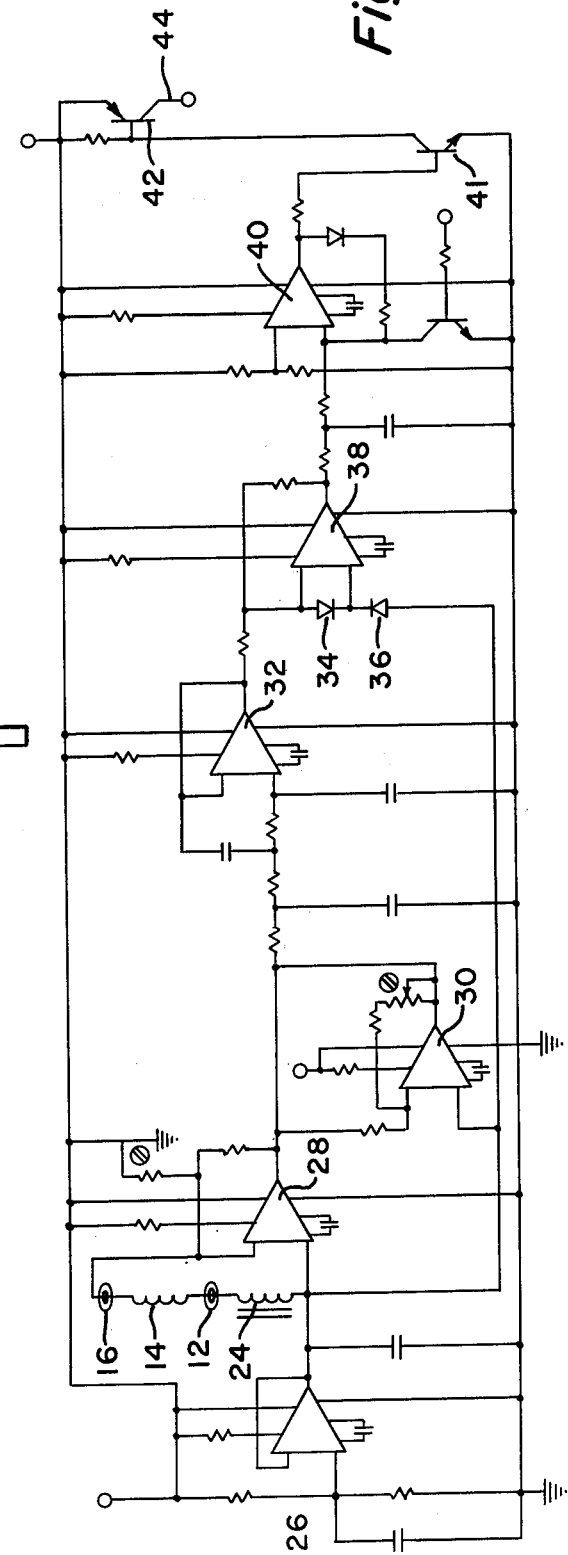

COMBINATION SEISMIC/MAGNETIC TRANSDUCER WITH FLOATING MAGNET

BACKGROUND OF THE INVENTION

As is known, there are many instances in which it is necessary to detect various types of objects in industrial applications where discrimination is required between them. For example, it is sometimes necessary to detect whether an object is moving or stationary, whether it is magnetically permeable or non-magnetically permeable, and whether it is vibrating. In the past, no suitable single detector has been devised for accomplishing all of these functions.

SUMMARY OF THE INVENTION

In accordance with the present invention, a new and improved combination seismic/magnetic transducer is provided which can detect movement of magnetically-permeable objects and, at the same time, can detect vibrations in either magnetic or non-magnetic objects.

The transducer of the invention comprises a pair of vertically-spaced, doughnut-shaped magnets, the lower magnet of which is secured to a non-magnetic rod and the upper magnet of which floats on the rod, the magnets having like poles facing each other to produce an opposed magnetic flux field which repels the floating magnet upwardly from the fixed magnet. Surrounding the non-magnetic rod and positioned within the opposed magnetic flux field between the magnets is a coil, the arrangement being such that any disturbances of the assembly causes the upper magnet to move in a vertical direction, thereby causing a disturbance to the opposed flux field. This disturbance is then detected by the coil as an EMF which can be amplified and read as an electrical signal having distinct characteristics.

Secured to the lower end of the non-magnetic rod is a relatively long rod of high permeability which serves as a magnetic sensor. That is, it can detect the presence of a magnetically-permeable body as a disturbance in the earth's magnetic field. This magnetically-permeable rod is also surrounded by a coil to detect the EMF generated when in the presence of a moving object such as a vehicle. When both coils are connected in series, the whole unit becomes a combination seismic/magnetic transducer which, for example, can detect vehicles both in motion as well as when they are standing still due to the vibration of the engine. Since the full flux field of the seismic portion of the transducer is constantly biasing the coil disposed between the opposed magnets, sensitivity is obtained by the slightest motion. This is not possible in present-day single magnetic or seismic transducers.

The above and other objects and features of the invention will become apparent from the following detailed description taken in connection with the accompanying drawings which form a part of this specification, and in which:

FIG. 1 is an illustration of the combination seismic/magnetic transducer of the invention; and FIG. 2 is a schematic circuit diagram of the circuitry connected to the detector of FIG. 1 for producing output electrical signals indicative of movement of a magnetically-permeable body, or vibration of a body.

With reference now to the drawings, and particularly to FIG. 1, the detector shown includes a non-magnetic upper rod 10 which may, for example, be formed from polystyrene or another suitable plastic material. Secured to the plastic rod 10 and surrounding the same is a first doughnut-shaped magnet 12 having its north pole on its upper face. Above the first magnet 12, and also secured to the rod 10, is a surrounding pancake coil seismic sensor 14. Above the coil 14 and also surrounding the rod 10 is a second doughnut-shaped magnet 16 which has its north pole facing downwardly. Magnet 16, however, is not secured to the rod 10; and since the lower north pole of the magnet 16 faces the upper north pole of the magnet 12, magnet 16 will be repelled upwardly and will "float" on the rod 10. Any disturbance to the device, however, will cause a movement in the upper magnet 16 relative to magnet 12, thereby causing a disturbance to the opposed magnetic field between the magnets 12 and 16 which generates an EMF in the coil 14. A plastic cover 18, for example, may enclose the upper floating magnet 16.

Depending downwardly from the non-magnetic rod 10 is a longer rod 20 formed from magnetically-permeable material and surrounded by a high "Q" magnetic sensing coil 24. The entire assembly shown in FIG. 1 is supported in any suitable manner, not shown, so that the rod 20 will pass through or cut the earth's magnetic field.

With reference now to FIG. 2, the circuit shown includes a regulator section incorporating an operational amplifier 26 having its output connected to one input of a second operational amplifier 28. Connected between the two input terminals of the operational amplifier 28, in series, are the two coils 14 and 24 shown in FIG. 1, the coil 14 being disposed between the two magnets 12 and 16. An output, or a change in output, appears from operational amplifier 28 when either: (1) the magnet 16 associated with coil 14 is disturbed by a seismic disturbance; or (2) coil 24 and its associated high permeability rod 20 detect a change in magnetic field. The output from operational amplifier 28 is amplified in preamplifier 30 and its associated circuitry. The output from coils 14 and 24 can be separately amplified and added algebraically. The resulting signal is then filtered by a low-pass filter section consisting of operational amplifier 32 and its associated circuitry to eliminate unwanted noise. The signal is then full-wave rectified by diodes 34 and 36 and applied to the input of operational amplifier 38. If the rectified signal is of sufficient amplitude, a signal is produced at the output of operational amplifier 40 (which acts as a level detector) and is applied to amplifying transistors 41 and 42 to produce an output at terminal 44.

As will be understood, the invention has the ability to recognize and discriminate between different types of bodies such as a moving vehicle whether in motion or stopped. For example, if a vehicle is detected and is moving across the top of the combined sensor shown in FIG. 1, both the seismic and magnetic portions of the transducer will react. However, if the vehicle stops above the sensor and no EMF is being generated, the seismic portion of the transducer (i.e., coil 14) will detect the motion of the vehicle's running engine, thus giving off a constant signal. Since the full flux field of the seismic portion of the transducer is constantly biasing the coil 14, sensitivity is obtained by the slightest motion.

In the illustrative embodiment of the invention shown herein, the seismic and magnetic sensors are connected in series; however, it will be appreciated that each coil can be incorporated singly in two separate circuits which provide two outputs, one for the seismic signal and one for the magnetic signal. With this separate implementation, it is possible to discriminate between signals which are purely seismic, purely magnetic in origin, or both.

Although the invention has been shown in connection with certain specific embodiments, it will be readily apparent to those skilled in the art that various changes in form and arrangement of parts may be made to suit requirements without departing from the spirit and scope of the invention.

I claim as my invention:

1. A combination seismic/magnetic transducer comprising a first coil, a first fixed permanent magnet on one side of said coil and having north and south poles aligned with the axis of the coil, a floating permanent magnet on the other side of said coil and also having north and south poles aligned with the axis of the coil, said magents having like poles facing each other whereby seismic disturbances will cause said floating magnet to move relative to said fixed magnet to induce an EMF in said first coi, means for guiding said floating magnet for movement toward and away from said first coil, a rod of magnetically-permeable material connected through an insulator to said fixed magnet and said first coil, and a second coil surrounding said magnetically-permeable rod whereby a second EMF will be induced in said second coil when a magnetically-permeable body is in motion adjacent said rod.

2. The transducer of claim 1 wherein said insulator comprises an insulating rod and said first magnet and said first coil are mounted on said insulating rod, said floating permanent magnet being a doughnut-shaped magnet which surrounds said insulating rod on the side of said coil opposite said fixed magnet.

3. The transducer of claim 2 wherein said magnetically-permeable rod is secured to one end of said insulating rod.

4. The transducer of claim 3 wherein said magnetically-permeable rod is connected to the end of said insulating rod opposite said floating permanent magnet.

5. The transducer of claim 1 wherein said first and second coils are connected in series across the input terminals of an operational amplifier, the output of said operational amplifier being connected through a filter to a full-wave rectifier.

* * * * *